US012667952B1

(12) United States Patent
Kordus

(10) Patent No.: US 12,667,952 B1
(45) Date of Patent: Jun. 30, 2026

(54) LOW PROFILE DISPLAY FOR POWER TOOLS

(71) Applicant: Snap-on Incorporated, Kenosha, WI (US)

(72) Inventor: Bryan J. Kordus, Kenosha, WI (US)

(73) Assignee: Snap-on Incorporated, Kenosha, WI (US)

( * ) Notice: Subject to any disclaimer, the term of this patent is extended or adjusted under 35 U.S.C. 154(b) by 0 days.

(21) Appl. No.: 19/008,129

(22) Filed: Jan. 2, 2025

(51) Int. Cl.
 *B25F 5/02* (2006.01)
 *B25B 21/00* (2006.01)
 *B25B 23/147* (2006.01)
 *G06F 3/02* (2006.01)
 *H05K 5/02* (2006.01)

(52) U.S. Cl.
 CPC ................. *B25F 5/02* (2013.01); *G06F 3/02* (2013.01); *B25B 21/002* (2013.01); *B25B 21/004* (2013.01); *B25B 23/147* (2013.01); *H05K 5/0217* (2013.01)

(58) Field of Classification Search
 CPC . B25F 5/02; G06F 3/02; B25B 21/002; B25B 23/147
 See application file for complete search history.

(56) References Cited

U.S. PATENT DOCUMENTS

| | | | | | |
|---|---|---|---|---|---|
| 3,970,155 | A | * | 7/1976 | Otto | ........................... G01L 1/22 |
| | | | | | 73/862.26 |
| 4,669,319 | A | * | 6/1987 | Heyraud | ............. B25B 23/1425 |
| | | | | | 81/477 |
| 4,805,404 | A | * | 2/1989 | Dupin | ..................... B25B 21/00 |
| | | | | | 81/470 |
| 5,581,042 | A | * | 12/1996 | Tambini | .................. B25B 23/14 |
| | | | | | 73/862.21 |
| 6,119,562 | A | * | 9/2000 | Jenkins | ............... B25B 23/1427 |
| | | | | | 81/479 |
| 6,968,759 | B2 | * | 11/2005 | Becker | ................ B25B 23/1425 |
| | | | | | 81/479 |
| 7,089,810 | B2 | | 8/2006 | Hsieh | |
| 7,107,884 | B2 | * | 9/2006 | Cutler | ................. B25B 23/1425 |
| | | | | | 81/479 |
| 7,234,378 | B2 | * | 6/2007 | Reynertson, Jr. | ... B25B 23/1425 |
| | | | | | 81/479 |
| 7,313,990 | B1 | * | 1/2008 | Shiao | .................. B25B 23/1425 |
| | | | | | 81/479 |

(Continued)

FOREIGN PATENT DOCUMENTS

| | | | | | |
|---|---|---|---|---|---|
| JP | 2024540703 | A | * | 11/2024 | ........... B25B 23/141 |
| TW | M325900 | U | * | 1/2008 | ......... B25B 23/1425 |

*Primary Examiner* — Lucas E. A. Palmer
(74) *Attorney, Agent, or Firm* — Taft, Stettinius & Hollister LLP

(57) ABSTRACT

A low profile integrated display that is integrated into a neck housing of a tool, such as a powered ratchet or powered torque wrench. A portion or section of the neck housing is removed to provide clearance for and receive a display assembly that includes a printed circuit board (PCB), display screen, lens, and buttons. A support/barrier is also placed between the PCB and a drive shaft of the tool to separate, support, and protect the PCB from the drive shaft of the tool. This allows the display assembly to be integrated into the neck housing of a tool, instead of a handle of the tool, which provides for a smaller profile of the tool compared to prior art tools, and reduces the risk of damage to the display assembly.

20 Claims, 6 Drawing Sheets

(56)　　　　References Cited

U.S. PATENT DOCUMENTS

| | | | |
|---|---|---|---|
| 7,370,539 B2 * | 5/2008 | Gharib | B25B 23/1427 |
| | | | 73/862.08 |
| D580,720 S | 11/2008 | Shiao | |
| 7,448,284 B2 | 11/2008 | Hsieh | |
| 7,469,602 B2 | 12/2008 | Gharib et al. | |
| 7,562,589 B2 * | 7/2009 | Anjanappa | B25B 23/1425 |
| | | | 81/479 |
| 7,841,245 B1 * | 11/2010 | Chen | G01D 7/00 |
| | | | 73/862.23 |
| 8,091,438 B1 * | 1/2012 | Huang | B25B 23/14 |
| | | | 73/862.23 |
| 8,201,464 B2 * | 6/2012 | Anjanappa | B25B 23/1425 |
| | | | 73/862.21 |
| 8,272,301 B2 * | 9/2012 | Huang | B25B 23/0021 |
| | | | 81/479 |
| D699,531 S * | 2/2014 | Olson | D8/24 |
| D702,519 S * | 4/2014 | Lee | D8/24 |
| 8,943,932 B2 * | 2/2015 | Hsieh | B25B 23/1425 |
| | | | 81/479 |
| 9,649,753 B2 * | 5/2017 | Hsieh | G08B 21/182 |
| 10,562,161 B2 * | 2/2020 | Flath | G01L 5/24 |
| 10,625,405 B2 | 4/2020 | Silha et al. | |
| 11,338,416 B2 * | 5/2022 | Hsieh | B25B 13/102 |
| 11,396,091 B2 * | 7/2022 | Adams | B25B 23/141 |
| 11,981,001 B2 * | 5/2024 | Hsieh | B25B 13/463 |
| 12,220,793 B2 * | 2/2025 | Tettamanti | B25B 23/0035 |
| 2005/0087041 A1 * | 4/2005 | Albertson | B25B 23/0035 |
| | | | 81/57.39 |
| 2006/0005637 A1 * | 1/2006 | Hirai | B25B 23/14 |
| | | | 73/862.21 |
| 2009/0153581 A1 | 6/2009 | Hsieh | |
| 2011/0192235 A1 * | 8/2011 | Hsu | B25B 23/1425 |
| | | | 73/862.23 |
| 2012/0006161 A1 * | 1/2012 | Chen | G01L 5/24 |
| | | | 81/479 |
| 2012/0167721 A1 * | 7/2012 | Fluhrer | B25F 5/00 |
| | | | 173/1 |
| 2012/0312132 A1 * | 12/2012 | Li | B25B 23/1425 |
| | | | 81/479 |
| 2013/0047799 A1 * | 2/2013 | Gareis | B25B 13/467 |
| | | | 81/467 |
| 2013/0199344 A1 * | 8/2013 | Lee | B25B 23/1425 |
| | | | 81/467 |
| 2014/0165798 A1 * | 6/2014 | Hsieh | B25B 23/1425 |
| | | | 81/479 |
| 2015/0007699 A1 * | 1/2015 | Lee | B25B 23/1425 |
| | | | 81/180.1 |
| 2016/0288304 A1 * | 10/2016 | Shiao | B25B 23/1425 |
| 2018/0071901 A1 * | 3/2018 | Silha | B25B 21/004 |
| 2019/0275647 A1 * | 9/2019 | Silha | B25B 23/147 |
| 2021/0122016 A1 * | 4/2021 | Hsu | B25B 23/147 |
| 2024/0198498 A1 * | 6/2024 | Lai | B25B 23/16 |
| 2025/0276428 A1 * | 9/2025 | Nakamura | B25F 5/02 |
| 2025/0387885 A1 * | 12/2025 | Zheng | B25B 21/00 |

* cited by examiner

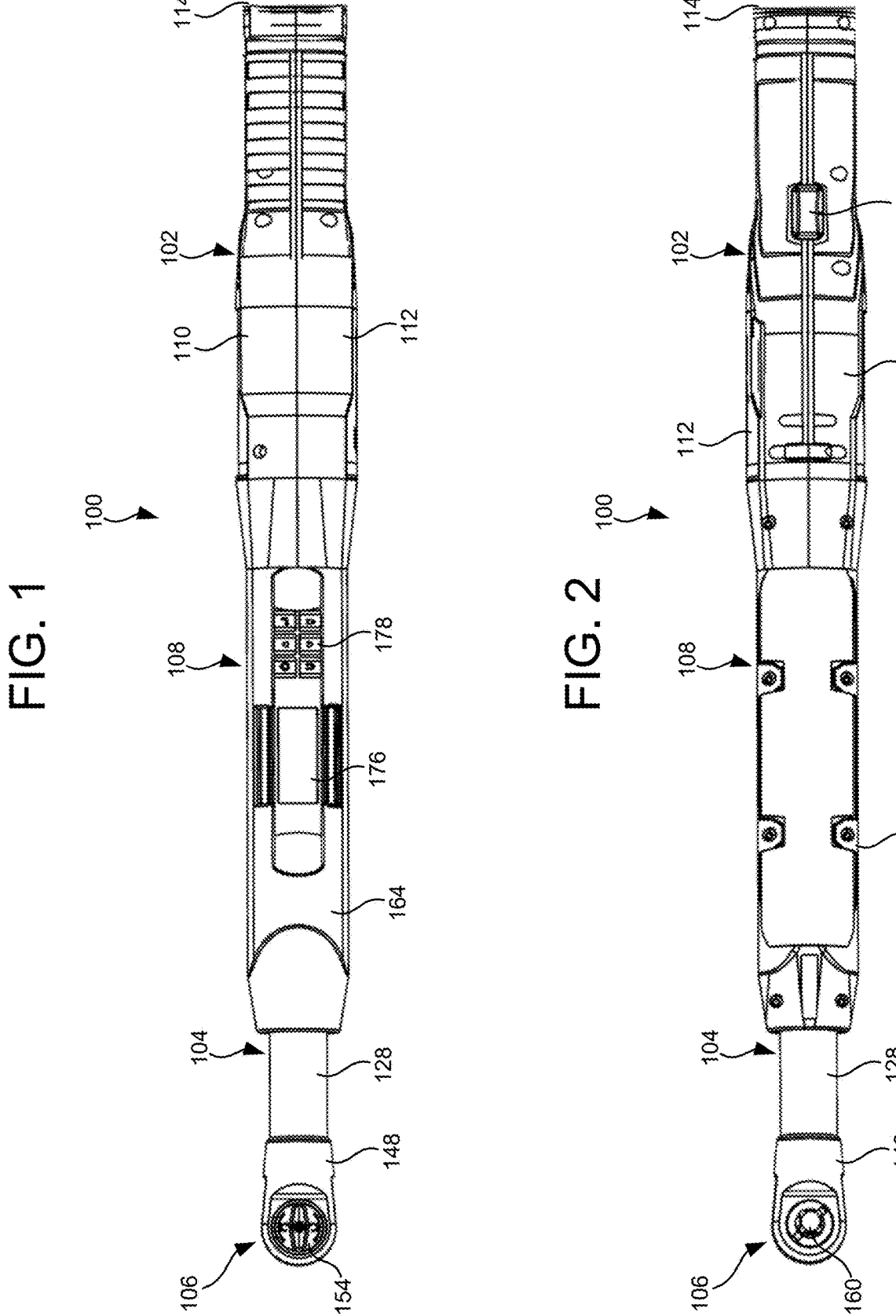

LOW PROFILE DISPLAY FOR POWER TOOLS

FIELD OF INVENTION

The present invention relates generally to power tools, and more particularly to user interfaces and displays of power tools.

BACKGROUND OF THE INVENTION

Power tools, such as power ratchets, and other types of tools, are commonly used in automotive, industrial, and household applications to install and remove threaded fasteners and apply a torque and/or angular displacement to a work piece, such as a threaded fastener, for example. Many power tools are portable and electrically powered, such as with a rechargeable battery, allowing a user to apply torque or force to a workpiece without exerting a substantial amount of energy. Power tools generally include a housing that supports a display and houses a motor and electronic components for controlling the motor. However, in the current tools, the display tends to be bulky and protrudes from the tool, which limits the ability of the tools to be used in tight spaces.

SUMMARY OF THE INVENTION

The present invention relates broadly to a low profile integrated display that is integrated into an elongated housing portion or neck housing of a tool, such as a powered ratchet or powered torque wrench. A portion or section of the neck housing is removed to provide clearance for and receive a display assembly that includes a printed circuit board (PCB), display screen, lens, and user input interface. A support/barrier is also placed between the PCB and a drive shaft of the tool to separate, support, and protect the PCB from the rotating drive shaft of the tool. This allows the display assembly to be integrated into the neck housing, instead of a handle of the tool, which provides for a smaller profile of the tool compared to prior art tools, and reduces the risk of damage to the display assembly. With the smaller profile, the tool can reach into tighter spaces compared to prior art tools.

In an embodiment, the present invention relates to a display assembly for a tool including an elongated housing portion and a drive shaft disposed in the elongated housing portion, wherein the elongated housing portion includes a cutout formed in the elongated housing. The display assembly includes a barrier having first and second sides and a groove formed in the first side, wherein the barrier is adapted to be disposed in the cutout with the groove aligned with the drive shaft. A controller is disposed on the second side of the barrier, and a display screen is operably coupled to the controller.

In another embodiment, the present invention relates to a tool including a motor housing portion, a motor disposed in the motor housing portion, and a drive shaft operably coupled to the motor. The tool includes an elongated housing portion coupled to the motor housing portion and housing the drive shaft, wherein the drive shaft is rotatable within the elongated housing portion. A cutout is formed in the elongated housing, and a barrier is disposed in the cutout, wherein the barrier includes first and second sides and a groove formed in the first side and aligned with the drive shaft. A controller is disposed on the second side of the barrier, and a display screen is operably coupled to the controller.

BRIEF DESCRIPTION OF DRAWINGS

For the purpose of facilitating an understanding of the subject matter sought to be protected, there is illustrated in the accompanying drawing embodiments thereof, from an inspection of which, when considered in connection with the following description, the subject matter sought to be protected, its construction and operation, and many of its advantages, should be readily understood and appreciated.

FIG. 1 is a first side view of an exemplar tool, according to an embodiment of the present invention.

FIG. 2 is a second side view of the exemplar tool of FIG. 1.

DETAILED DESCRIPTION OF THE INVENTION

Figure 3:
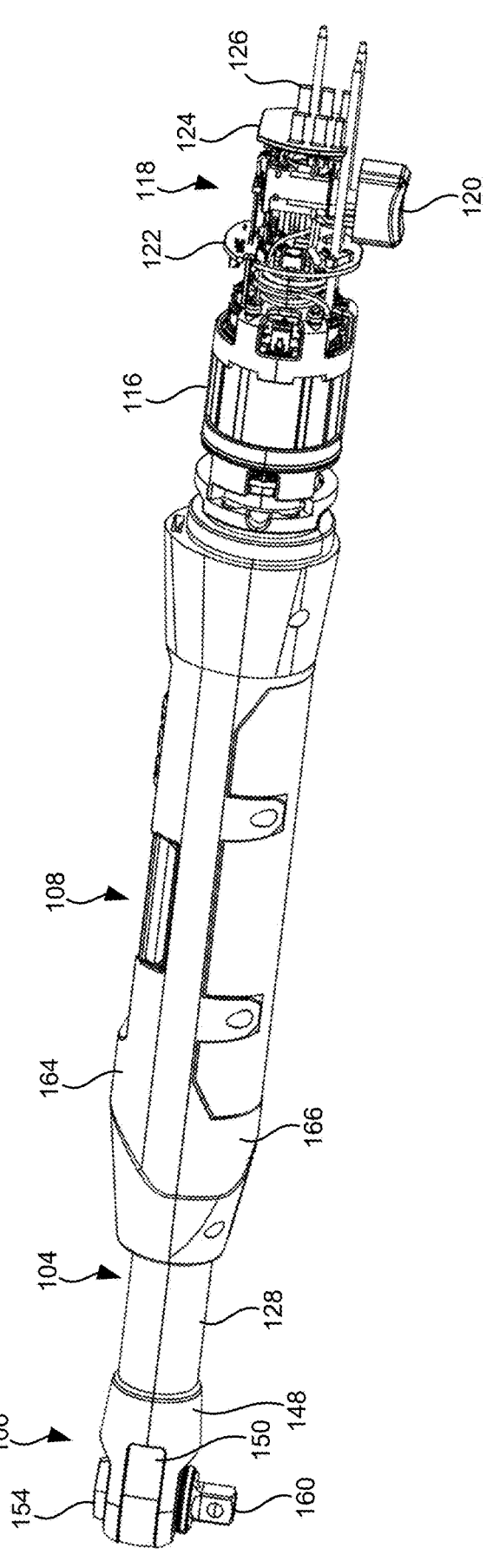
FIG. 3 is a perspective view of the exemplar tool of FIG. 1, with a motor housing removed, illustrating exemplar internal components of the tool.

While the present invention is susceptible of embodiments in many different forms, there is shown in the drawings, and will herein be described in detail, a preferred embodiment of the invention with the understanding that the present disclosure is to be considered as an exemplification of the principles of the invention and is not intended to limit the broad aspect of the invention to embodiments illustrated. As used herein, the term "present invention" is not intended to limit the scope of the claimed invention and is instead a term used to discuss exemplary embodiments of the invention for explanatory purposes only.

The present invention relates broadly to a low profile integrated display that is integrated into a neck housing of a tool, such as a powered ratchet or powered torque wrench. A portion or section of the neck housing is removed to provide clearance for and receive a display assembly that includes a controller/printed circuit board (PCB), display screen, lens, and user input interface. A support/barrier is also placed between the PCB and a drive shaft of the tool to separate, support, and protect the PCB from the rotating drive shaft of the tool. This allows the display assembly to be integrated into the neck housing, instead of a handle of the tool, which provides for a smaller profile of the tool compared to prior art tools, and reduces the risk of damage to the display assembly. With the smaller profile, the tool can reach into tighter spaces compared to prior art tools.

Referring to FIGS. 1-3, an exemplar tool 100 (such as a powered ratchet type tool and/or a powered torque wrench type tool) incorporating an embodiment of the present invention is illustrated. The exemplar tool 100 includes a motor housing portion (also referred to as a handle housing portion) 102, an elongated housing portion (also referred to as a neck housing portion) 104 that houses a drive shaft (as described in further detail below) and that is operably coupled to the motor housing portion 102, an output assembly 106 that is operably coupled to the elongated housing portion 104, and a display assembly 108 that is operably coupled to the elongated housing portion 104. The motor housing portion 102 may function as a handle of the tool 100 and include a grip for holding and manipulating the tool 100. The motor housing portion 102 may include first and second housing portions 110, 112 (respectively forming first and second sides of the motor housing portion 102). In an embodiment, the motor housing portion 102 is a clamshell-type housing, where the first and second housing portions 110, 112 are substantially mirror images of each other and coupled together via fasteners to cooperatively form the motor housing portion 102. In another embodiment, the motor housing portion 102 (including the first and second housing portions 110, 112) may be a single integrated or monolithic piece.

The motor housing portion 102 may extend from the elongated housing portion 104 and/or display assembly 108 to a power source receiving end 114 that is adapted to receive and couple to a power source, such as a removable battery pack, for providing power to the tool 100. As shown in FIG. 3, the motor housing portion 102 may house a motor 116, control electronics 118, and an actuatable trigger 120 adapted to operate the motor 116 and thereby the output assembly 106. The motor 116 is disposed in and supported in the motor housing portion 102 and operably coupled to the trigger 120 via the control electronics 118. The motor 116 may be a brushless DC (BLDC) or a brushed-type motor, or any other suitable motor (e.g., pneumatically or hydraulically operated or AC operated motor). The motor 116 may include a motor shaft (as known in the art) that is operably coupled to the output assembly 106. Thus, actuation of the trigger 120 by a user (such as depression of the trigger 120) causes the motor 116 to operate and operate the output assembly 106.

The control electronics 118 may include motor control electronics 122 operably coupled to and adapted to control the motor 116. For example, the motor control electronics 122 may include a motor printed circuit board (PCB) that is operably coupled to the trigger 120 and motor 116. The motor PCB may include one or more switching elements disposed thereon. The switching elements may be field effect transistors (FETs), such as, for example, metal-oxide semiconductor field-effect transistors (MOSFETs). In an embodiment, the switching elements may include three high-side switching elements, H1, H2, and H3, and three low-side switching elements, L1, L2, and L3, each being operable in either one of a first or conducting state and a second or non-conducting state. The switching elements are controlled to selectively apply power from a power source (e.g., a battery pack) to the motor 116 to achieve desired commutation. By selectively activating particular high-side and low-side switching elements, the motor 116 is operated by having the motor PCB send a current signal through coils located on a stationary part of the motor 116 called a stator. The coils cause a magnetic force to be applied to a rotating part of the motor 116, called a rotor, when current runs through the coils. The rotor contains permanent magnets that interact with magnetic forces created by the windings of the stator. By selectively activating successive combinations of high and low-side switching elements in a particular order, thereby sending a particular order of current signals through the windings of the stator, the stator creates a rotating magnetic field which interacts with the rotor causing it to rotate, which causes rotation of the motor shaft, in a well-known manner. The control electronics 118 may also include a power printed circuit board (PCB) 124 that is operably coupled to the motor control electronics 122, power receiving terminals 126, and the trigger 120. The power receiving terminals 126 are adapted to be operably coupled to a power source, such as a battery pack, to provide power to the tool 100. In an embodiment, the trigger 120 is operably coupled to the power PCB 124 and motor control electronics 122. Actuation of the trigger 120 (such as depression of the trigger 120) causes power to be supplied to the motor 116 and the motor 116 to operate and rotate the motor shaft in either one of first and second (e.g., forward and reverse or clockwise and counter-clockwise) rotational directions, in a well-known manner.

In an embodiment, the trigger 120 is a linearly depressible trigger that is depressible inwardly, relative to the tool 100, to cause the tool 100 to operate, and a release of the trigger 120 causes the trigger 120 to bias outwardly, relative to the tool 100, to cease operation of the tool 100. The trigger 120 and control electronics 118 may also operate via a variable speed type mechanism. In this regard, actuation or depression of the trigger 120 can cause the motor 116 to rotate the motor shaft at a faster speed the further the trigger 120 is depressed. In another embodiment, the trigger 120 may be a rocker type of trigger switch, where depression of a top portion (portion proximal to the elongated housing portion 104/display assembly 108) of the trigger 120 causes the tool 100 to operate in a first rotational direction (such as a clockwise rotational direction), and depression of a bottom portion (portion distal to the elongated housing portion 104/display assembly 108) of the trigger 120 causes the tool 100 to operate in a second rotational direction (such as a counter-clockwise rotational direction).

Referring to FIGS. 1-4, the elongated housing portion/neck housing portion 104 includes a neck housing 128 that is hollow and that houses a drive shaft 130 that is operably coupled to the motor 116. In an embodiment, the drive shaft 130 may be operably coupled to the motor 116 via a gear mechanism 132. The gear mechanism 132 may include a ring gear 134 with internal gear teeth that meshingly engage gear teeth of one or more pinion gears 136 that are operably coupled to a carrier 138. In this embodiment, a motor gear on the motor shaft of the motor 116 meshingly engages the gear teeth of the pinion gears 136, and a first end 140 of the drive shaft 130 includes gear teeth that meshingly engage with gear teeth of the carrier 138. Thus, rotation of the motor shaft of the motor 116 causes rotation of the drive shaft 130 within the neck housing 128. The drive shaft 130 may also be rotationally supported in the neck housing 128 via one or more bearings, such as bearings 142, 144, disposed around an external surface of the drive shaft 130. A second end of the drive shaft 130, opposite to the first end 140 and distal to the motor 116, may include an eccentric type crank 144. For example, the eccentric type crank 144 may include an offset pin with a bushing for operating the output assembly 106.

The output assembly 106 includes a head housing portion 148, a yoke 150 disposed in the head housing portion 148, and an output mechanism 152 disposed in the yoke 150 and head housing portion 148. The output mechanism 152 may include a selector switch 154, a pawl carrier 156, one or more pawls 158, and an output drive lug 160. The drive lug 160 is adapted to apply torque to a work piece, such as a fastener, via an adapter, bit, or socket coupled to the drive lug 160, such as a bi-directional ratcheting square or hexagonal drive. As illustrated, the drive lug 160 is a "male" connector designed to fit into or matingly engage a female counterpart. However, the drive lug 160 may alternately include a "female" connector designed to matingly engage a male counterpart. The drive lug 160 may also be structured to directly engage a work piece without requiring coupling to an adapter, bit, or socket. The rotational direction of the drive lug 160 can also be selected by rotation of the selector switch 154 to be either a first or second rotational direction (such as, clockwise or counterclockwise).

When assembled, the eccentric type crank 144 of the drive shaft 130 is disposed in a recess 162 of the yoke 150. Thus, when the trigger 120 is actuated (such as via depression of the trigger 120) power is supplied to the motor 116 and causes the motor 116 to operate and rotate the motor shaft, which causes rotation of the drive shaft 130, via the gear mechanism 132. Rotation of the drive shaft 130 causes oscillating motion of the yoke 150, via the eccentric type crank 144, which causes rotation of the output mechanism 152 and drive lug 160 in one of the selected first and second rotational directions (based on a position of the selector switch 154).

Figure 4:
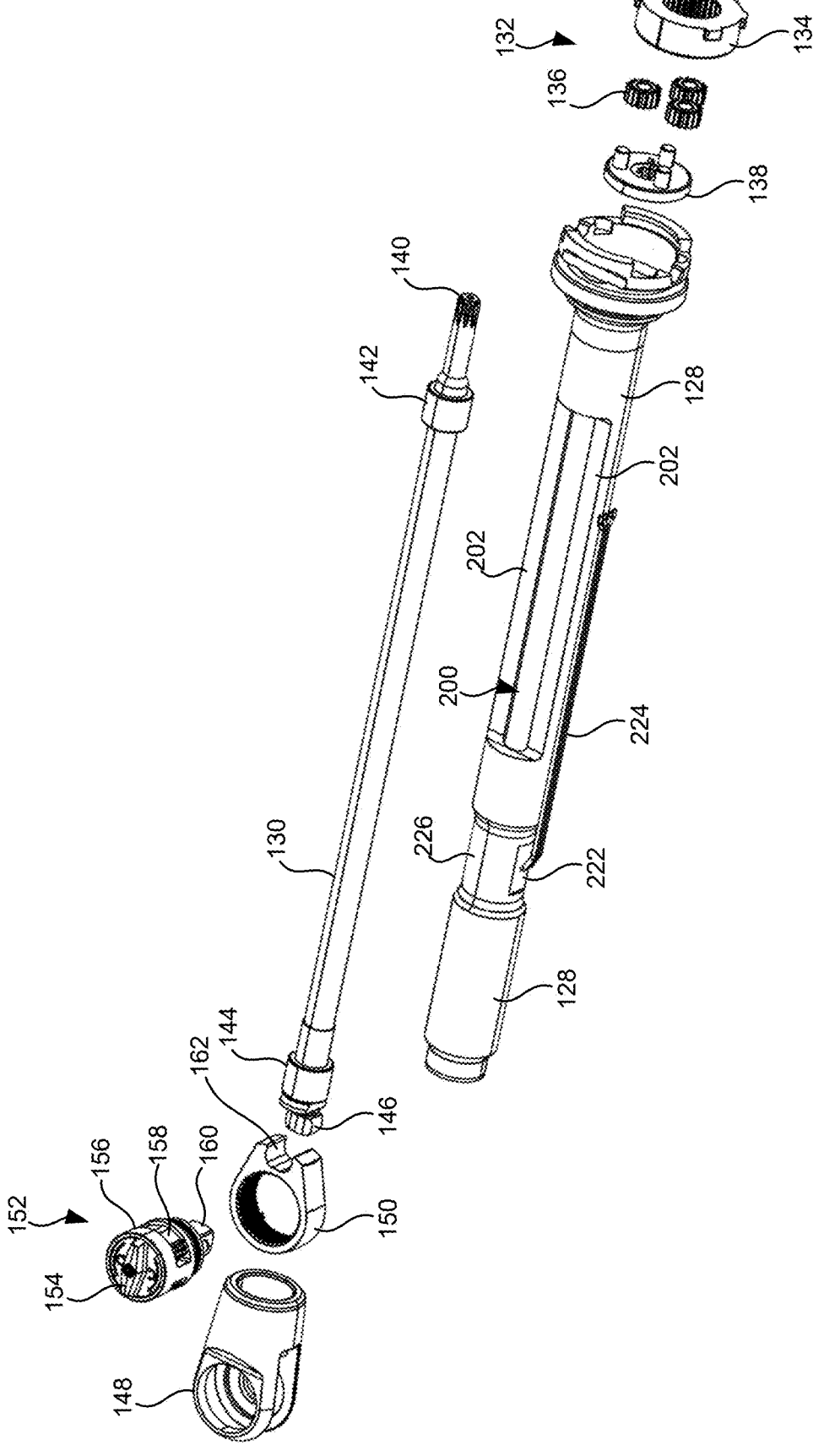
FIG. 4 is an exploded perspective view of a ratchet head, neck housing, and drive mechanism of the exemplar tool of FIG. 1.
Figure 5:
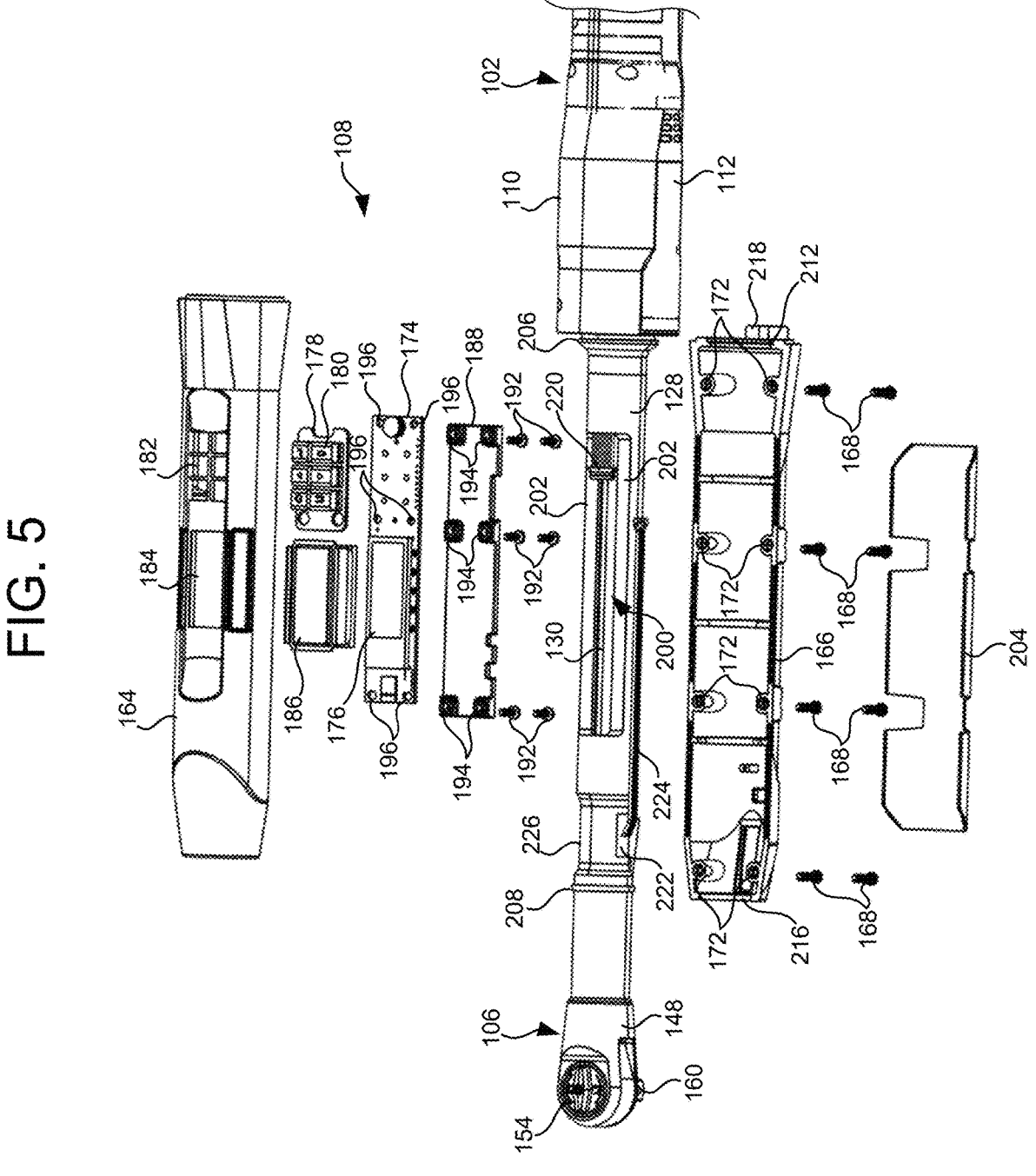
FIG. 5 is a first exploded perspective view of a display assembly of the exemplar tool of FIG. 1.
Figure 6:
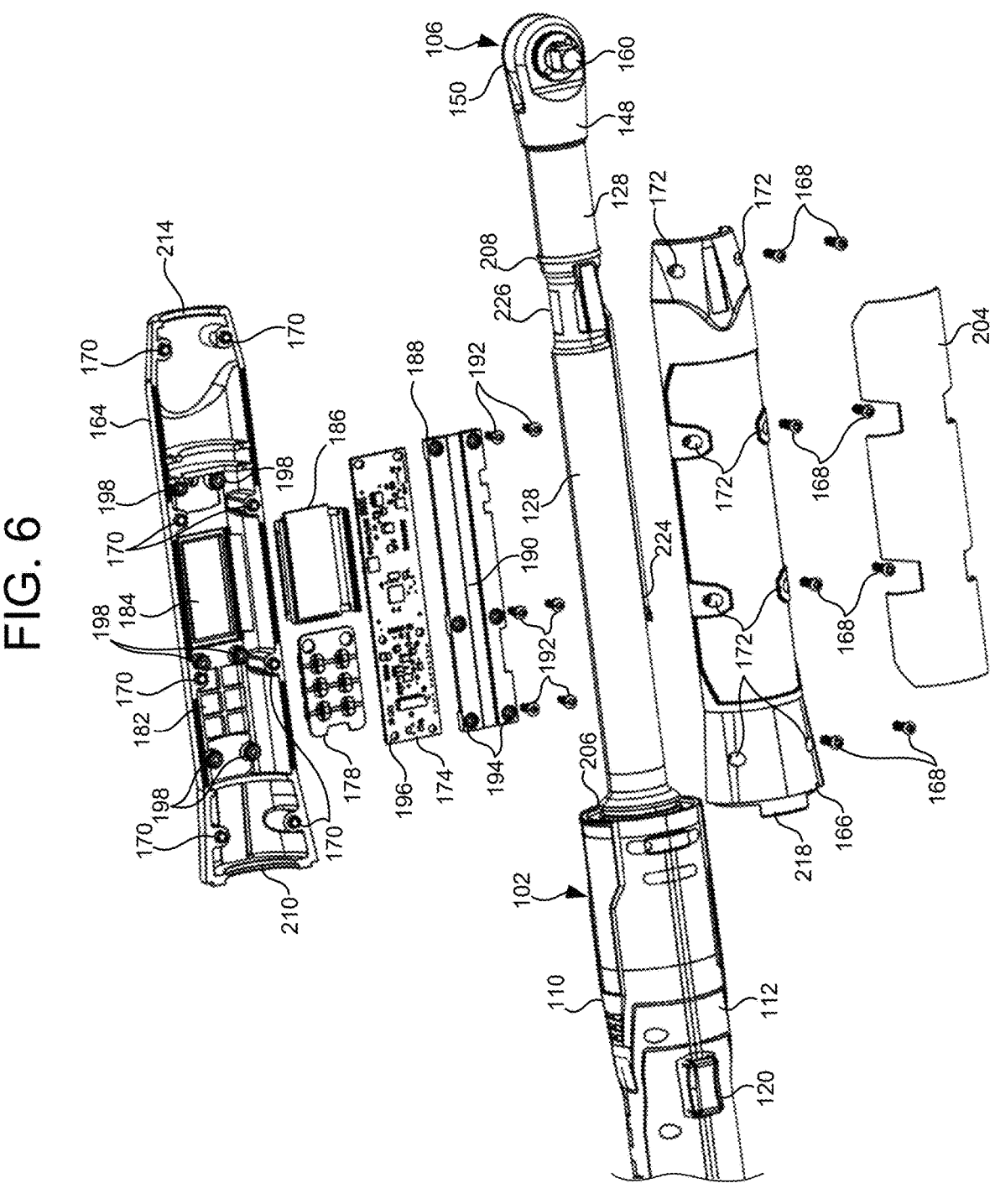
FIG. 6 is a second exploded perspective view of the display assembly of the exemplar tool of FIG. 1.

Referring to FIGS. 4-6, the tool 100 includes a low profile integrated display, such as display assembly 108, that is integrated into a neck housing 128 of the tool 100. The display assembly 108 includes a display housing including first and second display housing portions 164, 166 that are coupled together around the neck housing 128 of the tool 100 via fasteners 168 that engage fastener apertures 170 in the first display housing portion 164 and fastener apertures 172 in the second display housing portion 166. The display housing may house a controller, such as controller 174, a display screen 176 for displaying information related to a torquing operation and/or a torque application, and a user input interface 178 for receiving user input instructions, modifying settings of the tool 100, and/or interacting with menus presented on the display screen 176.

The display screen 176 is operably coupled to the controller 174 and is adapted to display various information for the user to view and interpret, for example, text, graphics, and/or information entered into the user input interface 178. By way of example, the display screen 176 can include a light emitting diode (LED) display screen, liquid crystal display (LCD) screen, organic light emitting diode (OLED) display screen, plasma display screen, or other kind of display that is capable of displaying information for the user to view and interpret.

The user input interface 178 is also operably coupled to the controller 174 and is adapted to receive input information, data, and/or commands into the tool 100. By way of example, the user input interface 178 can include buttons 180, such as one or more of a "home" button, up/down and/or left/right control buttons, an "enter" button, a "units" button, a "back" button, and/or other buttons. In other embodiments, the user input interface 178 can include other input devices, such as a touch screen/touch pad, audio/voice input, or other device(s) that allows for the input of information by a user. In an example, the buttons 180 allow the user to input a torque operation and/or a torque setting.

In an embodiment, the controller 174 is a control printed circuit board (PCB) and is operatively coupled to the display screen 174 and the input interface 178, for example, through the use of contact pads and/or other connections. The controller 174 may also include one or more of a processor for controlling operations of the controller 174, a memory/ data storage component for storing data and/or computer programs, and an interface for transmitting and/or receiving data relating to the tool 100 to external sources or devices. The processor may facilitate communication between the various components of the tool 100 and control operation of the electrical components of the tool 100. The memory/data storage component can store data or computer programs for use in the tool 100. For example, the memory/data storage component can store calibration factors, preset torque operations, torque target values, preset angle operations, angle target values, and other such data. Without limitation, the memory/data storage component can include non-transitory computer-readable recording medium, such as a hard drive, flash drive, volatile or non-volatile memory, read-only memory (ROM), random access memory (RAM), magne-toresistive RAM (MRAM), phase-change memory, ferro-electric RAM (FRAM), etc. The interface can be a device capable of transmitting data from the tool 100 or capable of receiving data within the tool 100 from an external data source or device. For example, the interface can be a hard wire connection or a wireless connection. For example, the interface can transmit and receive date via a wireless com-munication link using protocol, such as a Wi-Fi link (e.g., Wi-Fi direct), a cellular protocol (e.g., long Term Evolution (LTE), global System for Mobile Communication (GSM), code Division Multiple Access (CDMA), etc.), infrared, acoustic, radio frequency (RF), bluetooth, bluetooth smart (also known as bluetooth low energy), or any other protocol or other type of wired or wireless interface capable of communicating with an external device.

The first display housing portion 164 may also include one or more button apertures 182 adapted to receive corre-sponding buttons 180 of the input interface 178. The first display housing portion 164 may also include a display aperture 184, which may receive a lens 186, such as a clear plastic or glass window, that is disposed on the display screen 176 and is adapted to allow the user to view the display screen 176.

The display assembly 108 may also include a separator or barrier 188 that is adapted to be disposed between the controller 174 and the neck housing 128 and drive shaft 130 to separate, support, and protect the controller 174 from the rotating drive shaft 130 when the tool 100 is operated. The barrier 188 may be made out or a plastic or other polymeric material that is capable of separating/protecting the control-ler 174 from the rotating drive shaft 130. As illustrated in FIG. 6, the barrier 188 may include a recess or groove 190 in a side of the barrier 188 that faces in a direction of the drive shaft 130. The groove 190 extends along a longitudinal length of the barrier 188, and is adapted to align with and provide clearance for the drive shaft 130. This reduces the risk of the barrier 188 contacting and interfering with the drive shaft 130.

As illustrated in FIGS. 5 and 6, the display screen 176 and user input interface 178 are operably coupled to the con-troller 174 on a first side of the controller facing in a direction of the first display housing portion 164, and the barrier 188 is coupled to a second side of the controller facing in a direction of the neck housing 128 and drive shaft 130. In an embodiment, the lens 186, display screen 176, user input interface 178, controller 174, and barrier 188 may be assembled together with the first display housing portion 164 to form a unit that is then coupled to the neck housing 128. For example, lens 186, the display screen 176, user input interface 178, controller 174, barrier 188, and first display housing portion 164 may be assembled together via fasteners 192 that are respectively disposed in corresponding fastener apertures 194 of the barrier 188, fastener apertures 196 of the controller 174, and fastener apertures 198 of the first display housing portion 164. In other embodiments, one or more of the first display housing portion 164, lens 186, display screen 176, user input interface 178, controller 174, and barrier 188 may be assembled directly to the neck housing 128 by fasteners that extend through the neck housing 128 (for example, as shown and described below with reference to FIG. 7).

Referring to FIGS. 4 and 5, the neck housing 128 may include a cutout 200 that is adapted to receive the barrier 188. For example, the cutout 200 may be formed by a section of the neck housing 128 being removed along a longitudinal length of the neck housing 128 and facing in a direction of the first display housing portion 164, thereby exposing a portion of the drive shaft 130 that extends within the neck housing 128. The cutout 200 may have a length that substantially corresponds to a longitudinal length of the barrier 188 and may form flats 202 that extend along opposing sides of the drive shaft 130. The flats 202 are adapted to receive and support the barrier 188, with the groove 190 of the barrier being aligned with the drive shaft 130 to provide clearance for the drive shaft 130.

When the first display housing portion 164, lens 186, display screen 176, user input interface 178, controller 174, and barrier 188 are assembled onto the neck housing, with the barrier disposed in the cutout 200 and on the flats 202, the second display housing portion 166 may also be disposed on the neck housing 128 and coupled to the first display housing portion 164 via the fasteners 168 to form the display assembly. A cover portion 204 may also optionally be disposed on the exterior of the second display housing portion 166.

Referring to FIGS. 5 and 6, to restrict movement of the display assembly 108 along a longitudinal axis of the neck housing 128, the neck housing 128 may include first and second flanges 206, 208 that are received in corresponding recesses in the first and second display housing portions 164, 166. For example, the first flange 206 is received in first grooves 210, 212 in the respective first and second display housing portions 164, 166; and the second flange 208 is received in second grooves 214, 216 in the respective first and second display housing portions 164, 166. At least one of the first and second display housing portions 164, 166 may also include an anti-rotation tab that restricts rotational movement of the display assembly 108 with respect to the neck housing 128. For example, as shown in FIGS. 5 and 6, the second display housing portion 166 includes an anti-rotation tab 218 adapted to be disposed in and engage the motor housing portion 102 to restrict rotational movement of the display assembly 108 with respect to the neck housing 128.

When the display assembly 108 is assembled onto the neck housing 128, the controller 174 may also be operably coupled to the control electronics 118, for example, via wiring and/or connector 220 (shown in FIG. 5). This allows for power to be supplied from the power source, such as the battery, to the controller 174, display screen, and user input interface 178, as well as for the exchange of data and/or instructions between the controller 174 and the control electronics 118 for operating the tool 100.

Referring to FIGS. 4-6, in some embodiments, the tool 100 may be capable of measuring torque when the trigger 120 is actuated to cause the motor 116 to operate and torque to be applied to a work piece via rotation of the output drive lug 160 caused by operation of the motor 116 (i.e., motorized torque), and measuring torque applied to the work piece via manual rotation of the tool 100, and thereby the output drive lug 160, by a user (i.e. manual torque). The motorized torque may be measured based on monitoring and/or measuring an amount of current supplied to or drawn by the motor 116. In general, the amount of current is proportional to the amount of torque applied. Accordingly, my monitoring and/or measuring an amount of current supplied to or drawn by the motor 116, the amount of motorized torque applied to a work piece can be determined.

The manual torque may be measured using one or more torque sensors, such as a strain gauge. For example, one or more torque sensors 222 may be operably coupled to the neck housing 128, and operably coupled to the controller 174, via wiring 224, and to the control electronics 118, via the controller 174. The neck housing 128 may optionally include a reduced diameter portion 226 (i.e., a portion that has a smaller diameter than a remainder of the neck housing 128), and the torque sensor(s) 222 may be disposed on the reduced diameter portion 226. When the tool 100 is rotated by a user to apply manual torque to the work piece, the controller 174 receives one or more measurements from the torque sensor 222 and determines and indicated, for example via the display screen 176, the amount of manual torque applied to the work piece.

During torque application operations, the display screen 176 may display information, such as, for example, torque and/or angle information. The tool 100 may include torque sensor(s) 222, and may also include one or more angle sensors (such as rotation sensors and/or a gyroscope) to sense and measure an amount of angle of rotation applied to the work piece and one or more orientation sensors (such as an accelerometer and/or gravity sensor) to determine the angle of a longitudinal axis of the tool 100 relative to "down" (that is, relative to the force of gravity). Thus, the one or more angle sensors and/or orientation sensors may be incorporated into the display assembly 108 and/or the handle housing 102 and operably coupled to the controller 174 and/or control electronics 118. The sensors enable the tool 100 to measure, record, and display torque and angle data in substantially real time during torquing operations, as well as transmit that data in real time to an external device. In the context of the present invention, "real time" means "without significant delay" (e.g., measurement and processing delays not exceeding one second per data sample). Torque application and angle data may also be logged and stored with a time index by the tool 100 and/or a software application on the external device.

Figure 7:
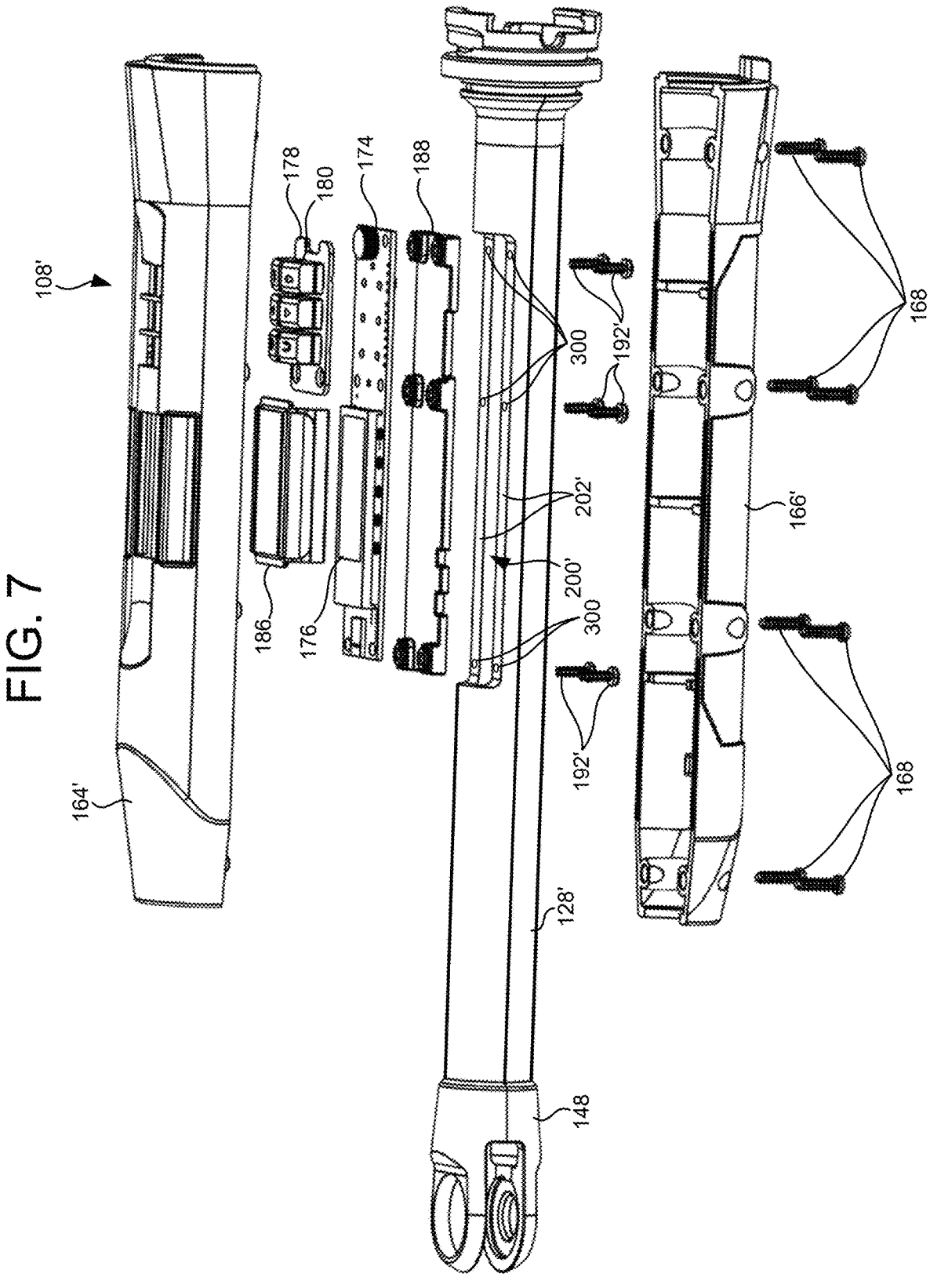
FIG. 7 is an exploded perspective view of a display assembly of an exemplar tool, according to another embodiment of the present invention.

As mentioned above, in other embodiments, one or more of the first display housing portion, lens, display screen, user input interface, controller, and barrier may be assembled directly to the neck housing by fasteners that extend through the neck housing. Referring to FIG. 7, a display assembly 108', which may be substantially the same as the display assembly 108, and a neck housing 128', which may be substantially the same as the neck housing 128, are illustrated. For example, the display assembly 108' may include the lens 186, display screen 176, user input interface 178, controller 174, and barrier 188 as described above. One difference between the display assemblies 108 and 108' is that the first display housing portion 164', lens 186, display screen 176, user input interface 178, controller 174, and barrier 188 may be assembled to the neck housing 128' by fasteners 192' that respectively extend through fastener apertures 300 in the neck housing 128' and into corresponding fastener apertures (similar to fastener apertures 198) in the first display housing portion 164'. The second display housing portion 166' may also be disposed on the neck housing 128' and coupled to the first display housing portion 164' via the fasteners 168, as described above, to form the display assembly 108'. Alternatively, the second display housing portion 166' may be directly coupled to the neck housing 128' via one or more fasteners.

With this assembly, it is not necessary for the neck housing 128' to include the flanges 206, 208 (although the flanges may be included), or the first and second display housing portions 164', 166' to include the grooves 210, 212, 214, 216 (although the grooves may be included), or the anti-rotation tab 218. This is because the first display housing portion 164', lens 186, display screen 176, user input interface 178, controller 174, and barrier 188 are coupled to the neck housing 128' by fasteners 192' that respectively extend through fastener apertures 300 in the neck housing 128', which restricts movement of the display assembly 108' with respect to the neck housing 128.

Another difference is that the neck housing 128' may not include the reduced diameter portion 226 and the torque sensor(s) 222, although the reduced diameter portion 226 and the torque sensor(s) 222 may be incorporated into the neck housing 128'.

While the tool 100 is described above as having an output drive lug 160, the tool 100 may have different types of output mechanisms. For example, the tool 100 may include a drill chuck, a hammer type output with a drill chuck or a drive lug, an impact type mechanism with a drill chuck or a drive lug, etc. The drive lug or drill chuck or can be coupled to other devices, such as a socket or other adapter, to apply torque to a work piece, such as, for example, a screw or bolt, in a well-known manner.

While the tool 100 is described as powered by a battery, the tool 100 may be power by other electrical power sources, such as an external wall outlet, etc.

As discussed herein, the tool 100 is a powered ratchet and/or powered torque wrench. However, the tool 100 can be any electrically powered or hand-held tool, including, without limitation, a hammer drill, impact drill, impact wrench, impact ratchet wrench, or other powered tool, that is powered by electricity via a power source (such as a wall outlet and/or generator outlet) or a battery. The tool 100 can also be any electrically powered or hand-held tool that incorporates a low profile display assembly as described herein.

As used herein, the term "coupled" and its functional equivalents are not intended to necessarily be limited to direct, mechanical coupling of two or more components. Instead, the term "coupled" and its functional equivalents are intended to mean any direct or indirect mechanical, electrical, or chemical connection between two or more objects, features, work pieces, and/or environmental matter. "Coupled" is also intended to mean, in some examples, one object being integral with another object. As used herein, the term "a" or "one" may include one or more items unless specifically stated otherwise.

The matter set forth in the foregoing description and accompanying drawings is offered by way of illustration only and not as a limitation. While particular embodiments have been shown and described, it will be apparent to those skilled in the art that changes and modifications may be made without departing from the broader aspects of the inventors' contribution. The actual scope of the protection sought is intended to be defined in the following claims when viewed in their proper perspective based on the prior art.

What is claimed is:

1. A tool including a motor housing portion, a motor disposed in the motor housing portion, and a drive shaft operably coupled to the motor, the tool comprising:

an elongated housing portion coupled to the motor housing portion and housing the drive shaft, wherein the drive shaft is rotatable within the elongated housing portion;

a cutout formed in the elongated housing;

a barrier disposed in the cutout, wherein the barrier includes first and second sides and a groove formed in the first side, wherein the groove extends longitudinally along the drive shaft;

a controller disposed on the second side of the barrier; and a display screen operably coupled to the controller.

2. The tool of claim 1, further comprising a user input interface operably coupled to the controller.

3. The tool of claim 1, further comprising a display housing disposed on the elongated housing portion and housing the controller.

4. The tool of claim 3, wherein the display housing includes a display aperture adapted to allow the display screen to be viewable.

5. The tool of claim 4, further comprising a lens disposed over the display screen and received in the display aperture.

6. The tool of claim 3, wherein the barrier, the controller, and the display screen are assembled to the display housing.

7. The tool of claim 1, wherein the barrier, the controller, and the display screen are assembled to the elongated housing portion with the controller disposed between the barrier and the display screen.

8. The tool of claim 1, wherein the elongated housing portion includes flats formed by the cut out, and the flats extend along opposing sides of the drive shaft.

9. The tool of claim 1, wherein the flats are adapted to receive and support the barrier.

10. The tool of claim 1, further comprising an output assembly coupled to the elongated housing portion opposite the motor housing portion and operably coupled to the drive shaft.

11. A display assembly for a tool including an elongated housing portion and a drive shaft disposed in the elongated housing portion, wherein the elongated housing portion includes a cutout formed in the elongated housing, the display assembly comprising:

a barrier including first and second sides and a groove formed in the first side, wherein the barrier is adapted to be disposed in the cutout with the groove extending longitudinally along the drive shaft;

a controller disposed on the second side of the barrier; and a display screen operably coupled to the controller.

12. The display assembly of claim 11, further comprising a user input interface operably coupled to the controller.

13. The display assembly of claim 11, further comprising a display housing adapted to be disposed on the elongated housing portion and house the controller.

14. The display assembly of claim 13, wherein the display housing includes a display aperture adapted to allow the display screen to be viewable.

15. The display assembly of claim 14, further comprising a lens disposed over the display screen and received in the display aperture.

16. The display assembly of claim 15, wherein the barrier, the controller, the display screen, and the lens are assembled to the display housing with the controller disposed between the barrier and the display housing.

17. The display assembly of claim 15, wherein the barrier, the controller, the display screen, the lens, and the display housing are adapted to be assembled to the elongated housing portion with the controller disposed between the barrier and the display housing.

18. The display assembly of claim 13, wherein the display housing includes first and second display housing portions that are adapted to be coupled together around the elongated housing portion.

19. The display assembly of claim 18, wherein the barrier, the controller, and the display screen are assembled to the first display housing portion with the controller disposed between the barrier and the first display housing portion.

20. The display assembly of claim 18, wherein the barrier, the controller, the display screen, and the first display housing portion are adapted to be assembled to the elongated housing portion with the controller disposed between the barrier and the first display housing portion.

* * * * *